United States Patent
Cleary et al.

(10) Patent No.: US 7,672,359 B2
(45) Date of Patent: Mar. 2, 2010

(54) SPREAD-SPECTRUM RECEIVERS WITH EXTENDED DYNAMIC RANGE

(75) Inventors: Dennis Cleary, Morris Plains, NJ (US);
Hayim Vitali Penso, Bronx, NY (US);
Christopher F. Zappala, Annandale, NJ (US)

(73) Assignee: Andrew LLC, Hickory, NC (US)

( * ) Notice: Subject to any disclaimer, the term of this patent is extended or adjusted under 35 U.S.C. 154(b) by 1751 days.

(21) Appl. No.: 10/766,347

(22) Filed: Jan. 28, 2004

(65) Prior Publication Data

US 2005/0163197 A1 Jul. 28, 2005

(51) Int. Cl.
*H04B 1/00* (2006.01)
(52) U.S. Cl. .................. 375/147; 455/250.1; 455/245.1; 455/249.1; 375/343
(58) Field of Classification Search ......... 375/130–145, 375/147, 260, 316, 345, 149, 152, 343; 455/249.1, 455/251.1, 136, 138, 140, 232.1, 240.1, 250.1, 455/245.1; 327/308, 179
See application file for complete search history.

(56) References Cited

U.S. PATENT DOCUMENTS

| | | | | |
|---|---|---|---|---|
| 5,640,416 A | * | 6/1997 | Chalmers | 375/147 |
| 5,812,600 A | * | 9/1998 | Hess et al. | 375/261 |
| 5,999,559 A | * | 12/1999 | Takaki | 375/130 |
| 6,134,430 A | * | 10/2000 | Younis et al. | 455/340 |
| 6,333,707 B1 | * | 12/2001 | Oberhammer et al. | 341/155 |
| 6,445,732 B1 | * | 9/2002 | Beamish et al. | 375/224 |
| 6,670,901 B2 | * | 12/2003 | Brueske et al. | 341/139 |
| 2003/0142730 A1 | * | 7/2003 | Lin | 375/147 |

* cited by examiner

*Primary Examiner*—David C Payne
*Assistant Examiner*—Rahel Guarino
(74) *Attorney, Agent, or Firm*—Mendelsohn, Drucker, & Associates, P.C.; Steve Mendelsohn

(57) ABSTRACT

A received analog spread-spectrum signal is selectively attenuated prior to digitization, where the amount of attenuation is based on the amplitude of the digitized signal before the digitized signal is filtered to compensate for interference that may exist in the received signal. By selectively attenuating the signal only when the digitized signal is relatively large, the receiver can be implemented using a relatively small analog-to-digital converter (ADC) than would otherwise be the case for a particular signal processing application. Taking advantage of the signal-concentration characteristics of spread-spectrum receivers, embodiments of the present invention can be designed to operate with signal having negative signal-to-noise ratios at the A/D conversion step.

24 Claims, 6 Drawing Sheets

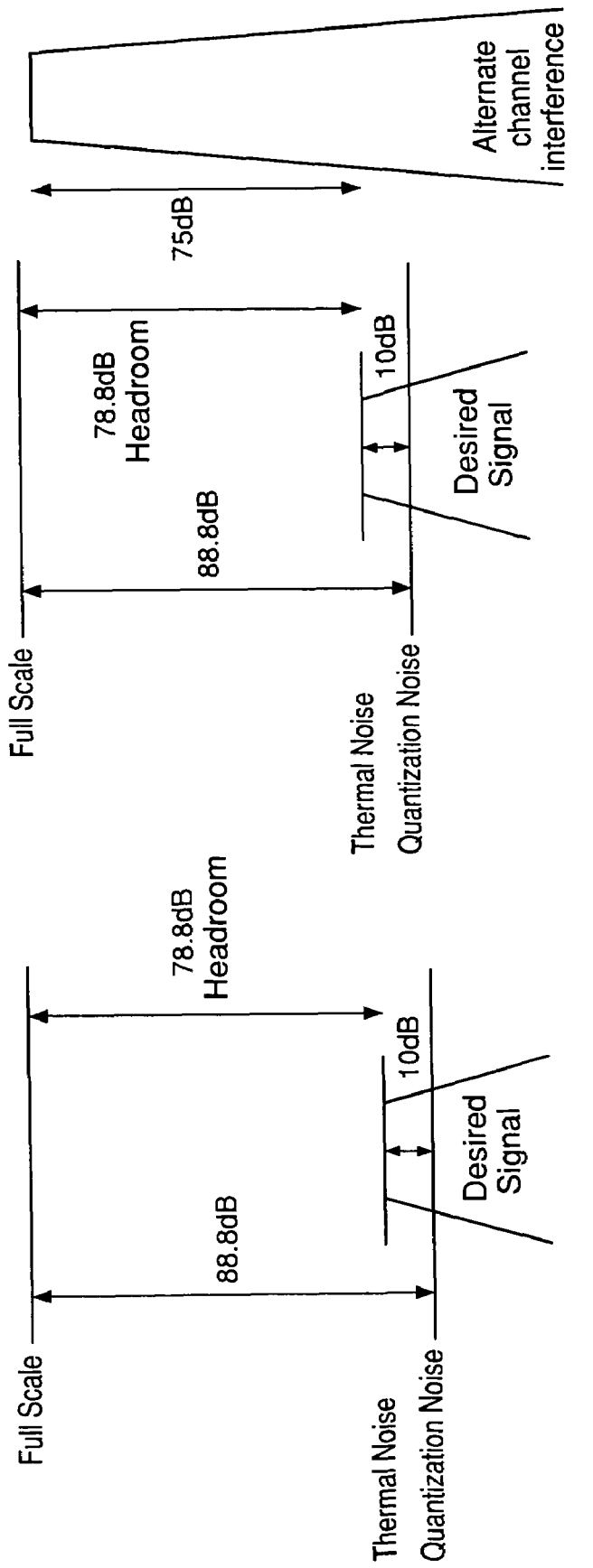

SPREAD-SPECTRUM RECEIVERS WITH EXTENDED DYNAMIC RANGE

FIELD OF THE INVENTION

The present invention relates to signal processing, and, in particular, to receivers for spread-spectrum signals.

BACKGROUND OF THE INVENTION

FIG. 1 shows a high-level block diagram of a conventional spread-spectrum receiver 100 of the prior art. Those skilled in the art will understand that certain elements such as filters, amplifiers, attenuators, oscillators, synthesizers, and the like have been omitted from this figure, as well as from other figures of receivers in this application.

As indicated in FIG. 1, receiver 100 receives a radio frequency (RF) spread-spectrum input signal 102 from an antenna. Mixer 104 downconverts input signal 102 from RF to an intermediate frequency (IF) using RF-to-IF mixing signal 106 to form IF signal 108. Analog-to-digital converter (ADC) 118 converts analog IF signal 108 into a digital IF signal 120. Using IF-to-baseband mixing signal 122, digital downconverter 124 downconverts IF signal 120 into a baseband signal 126. Digital (e.g., low-pass) filter 128 filters baseband signal 126, e.g., to filter out undesirable interference from other signals, to generate filtered signal 130, which is then subjected to further digital processing 132 (e.g., despreading/demodulation) to generate digital incoming data signal 134.

In a typical spread-spectrum receiver, such as receiver 100, errors can result from such phenomena as thermal noise from analog processing prior to the A/D conversion, non-coherent on-channel interference, and off-channel interference. It is assumed that digital filter 128 has a sufficient number of taps to reject off-channel interference prior to demodulation and provide a desired signal level above sensitivity to digital processing 132. Under these conditions, the level of interference that can be tolerated at the A/D conversion step is determined by the thermal noise and the dynamic range of ADC 118. Here, dynamic range is defined as the difference in dB between the full-scale ADC input level and the quantization-noise floor level, where the quantization-noise floor level is determined by the least significant bit (LSB) of the ADC.

The ADC dynamic range DR for first Nyquist zone sampling can be expressed by Equation (1) as follows:

$$DR(dB) = 6*N + 1.76 + 10*\log(BW_N/BW_S), \quad (1)$$

where N is the number of effective bits in the ADC (i.e., typically one fewer than the total number of bits), $BW_N$ is the Nyquist bandwidth (i.e., one-half the sample clock frequency), and $BW_S$ is the desired signal bandwidth. For a 14-bit ADC (with 13 effective bits) operating with a 61.44-MHz sample clock and a 3.84-MHz wide UMTS signal bandwidth, the dynamic range DR is 88.8 dB. In practice, sampling is performed at higher Nyquist zones, where there are additional noise contributions that reduce the dynamic range somewhat.

FIG. 2 shows a graphical representation of the relative levels of thermal noise, quantization noise, and a desired signal level for a 14-bit ADC receiving a UMTS signal at a signal-to-thermal-noise ratio ($SN_tR$) of 0 dB, where the $SN_tR$ is proportional to the log of (signal power/thermal noise power). As indicated in FIG. 2, for 10 dB of thermal noise, 78.8 dB of ADC headroom is provided, where ADC headroom is defined as the difference in dB between the full-scale ADC input level and a specified desired signal level (in this case, at 18 dB above sensitivity).

FIG. 3 shows a graphical representation of the relative signal and noise levels for the same 14-bit ADC when 75 dB of off-channel interference is introduced into the receiver above the desired signal level. Because the 14-bit ADC has 78.8 dB of headroom, this relatively large off-channel interference can be tolerated without overflowing the ADC. It is assumed that the off-channel interference can be sufficiently removed by digital filter 128 after the A/D conversion to enable satisfactory digital processing 132.

FIG. 4 shows a graphical representation of the relative signal and noise levels when receiver 100 is implemented using a 12-bit ADC instead of a 14-bit ADC for an $SN_tR$ of 0 dB. According to Equation (1), the ADC dynamic range DR is only 76.8 dB, and the ADC headroom is only 66.8 dB for first Nyquist zone sampling for a 12-bit ADC (with 11 effective bits) operating with a 61.44-MHz sample clock and a 3.84-MHz wide UMTS signal bandwidth.

FIG. 5 shows a graphical representation of the relative signal and noise levels for the 12-bit ADC of FIG. 4, when the same 75 dB off-channel interference of FIG. 3 is introduced. Here, the 66.8 dB of ADC headroom is insufficient to tolerate such relatively large off-channel interference, and the ADC will overflow, resulting in undesirable data errors downstream.

BRIEF DESCRIPTION OF THE DRAWINGS

Aspects, features, and advantages of the present invention will become more fully apparent from the following detailed description, the appended claims, and the accompanying drawings in which like reference numerals identify similar or identical elements.

FIG. 2 shows a graphical representation of the relative signal and noise levels for the receiver of FIG. 1 implemented with a 14-bit ADC and receiving a UMTS signal at an $SN_tR$ of 0 dB;

FIG. 3 shows a graphical representation of the relative signal and noise levels for the receiver of FIG. 2 when 75 dB of off-channel interference is introduced into the receiver above the desired signal;

FIG. 9 shows a graphical representation of the relative signal and noise levels at 18 dB above sensitivity when the receiver of FIG. 8 is implemented using a 12-bit ADC for a UMTS signal having an $SN_qR$ of −10 dB, where the 20 dB variable attenuator of FIG. 6 is turned on.

DETAILED DESCRIPTION

Figure 1:
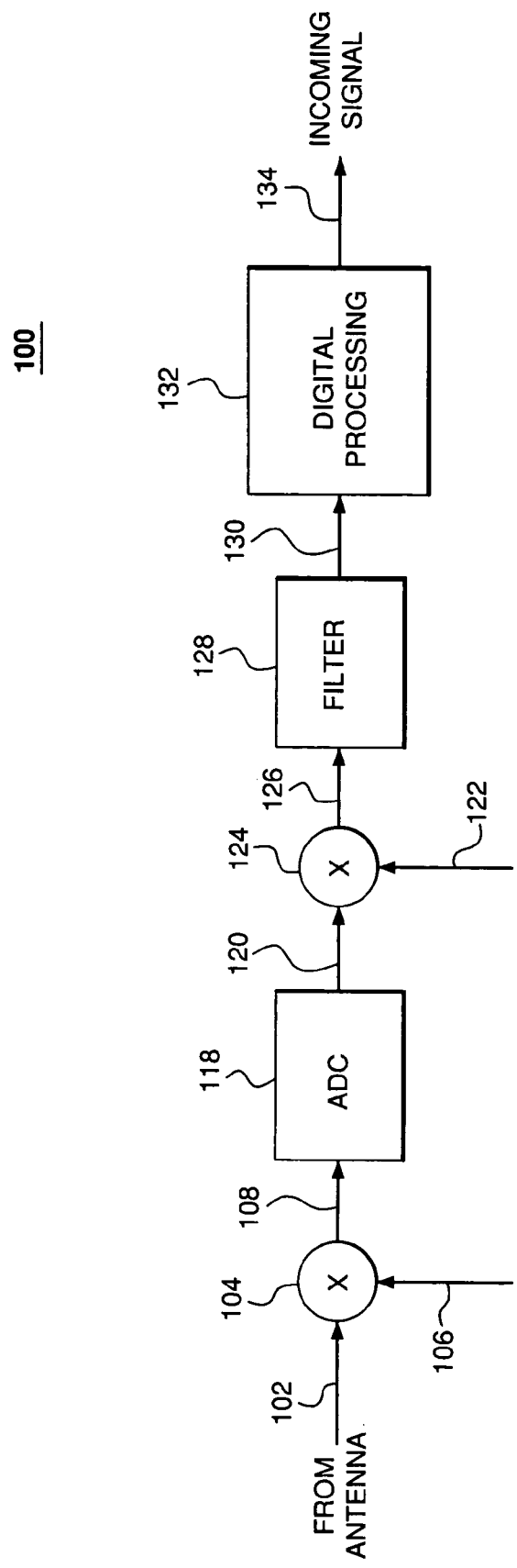
FIG. 1 shows a high-level block diagram of a conventional spread-spectrum receiver of the prior art.
Figure 6:
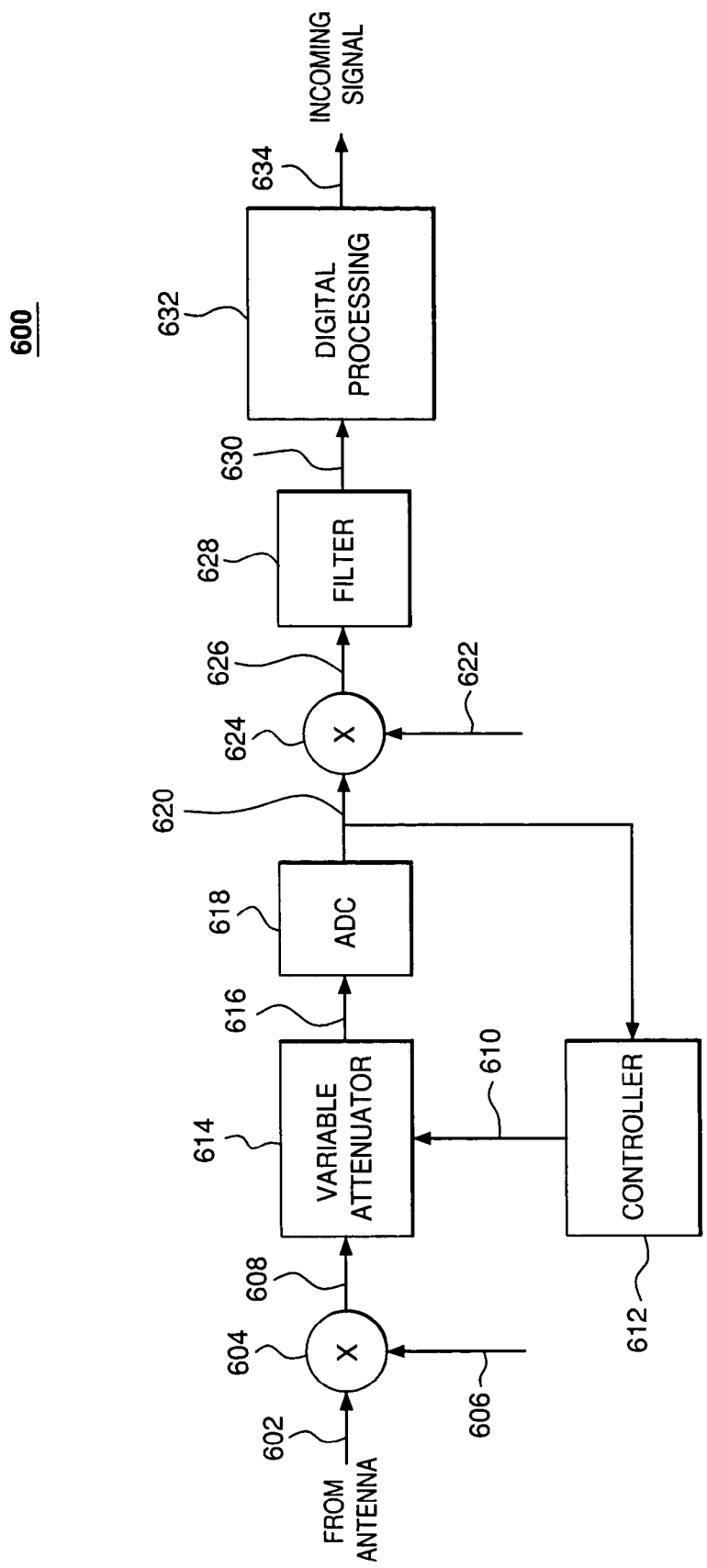
FIG. 6 shows a high-level block diagram of a spread-spectrum receiver, according to one embodiment of the present invention.

FIG. 6 shows a high-level block diagram of a spread-spectrum receiver 600, according to one embodiment of the present invention. Receiver 600 is similar to prior-art receiver 100 of FIG. 1, except that receiver 600 also has a variable attenuator 614 that selectively attenuates the incoming signal based on a control signal generated by a controller 612 monitoring the output of ADC 618 (i.e., prior to interference filter 628).

In particular, receiver 600 receives an RF spread-spectrum input signal 602 from an antenna. Mixer 604 downconverts input signal 602 from RF to IF using RF-to-IF mixing signal 606 to form IF signal 608. Depending on a control signal 610 from controller 612, variable attenuator 614 selectively attenuates IF signal 608 to generate an attenuated IF signal 616. Alternatively, control signal 610 can instruct variable attenuator 614 not to attenuate IF signal 608. In either case, ADC 618 converts the analog IF signal into a digital IF signal 620. Using IF-to-baseband mixing signal 622, digital downconverter 624 downconverts IF signal 620 into a baseband signal 626. Digital filter 628 filters baseband signal 626 to generate filtered baseband signal 630, which is then subjected to further digital processing 632 (e.g., de-spreading/demodulation) to generate digital incoming data signal 634.

In one possible implementation, controller 612 samples and compares the output of ADC 618 to a specified (e.g., programmable) upper threshold level. When the ADC output exceeds the upper threshold, controller 612 turns on variable attenuator 614 via control signal 610, in which case, the analog signal presented to ADC 618 is an attenuated version of IF signal 608 generated by mixer 604. Similarly, when the ADC output is less than a specified (e.g., programmable) lower threshold level, controller 612 turns off variable attenuator 614, in which case, the analog signal presented to ADC 618 is an un-attenuated version of IF signal 608. In order to avoid having the receiver toggle back and forth repeatedly between attenuation and non-attenuation, the lower threshold level is preferably lower than the upper threshold level by at least the amount of attenuation applied by variable attenuator 614. In fact, in preferred implementations, hysteresis is achieved by setting the threshold levels such that the difference between the upper and lower thresholds is slightly greater than the applied attenuation. In addition or alternatively, hysteresis can be achieved by requiring the signal level to be higher than the upper threshold or lower than the lower threshold for a specified amount of time before changing the state of the attenuator. In any case, hysteresis can be used to avoid situations in which slight fluctuations in signal level result in undesirably rapid toggling on and off of the attenuator.

Figure 7:
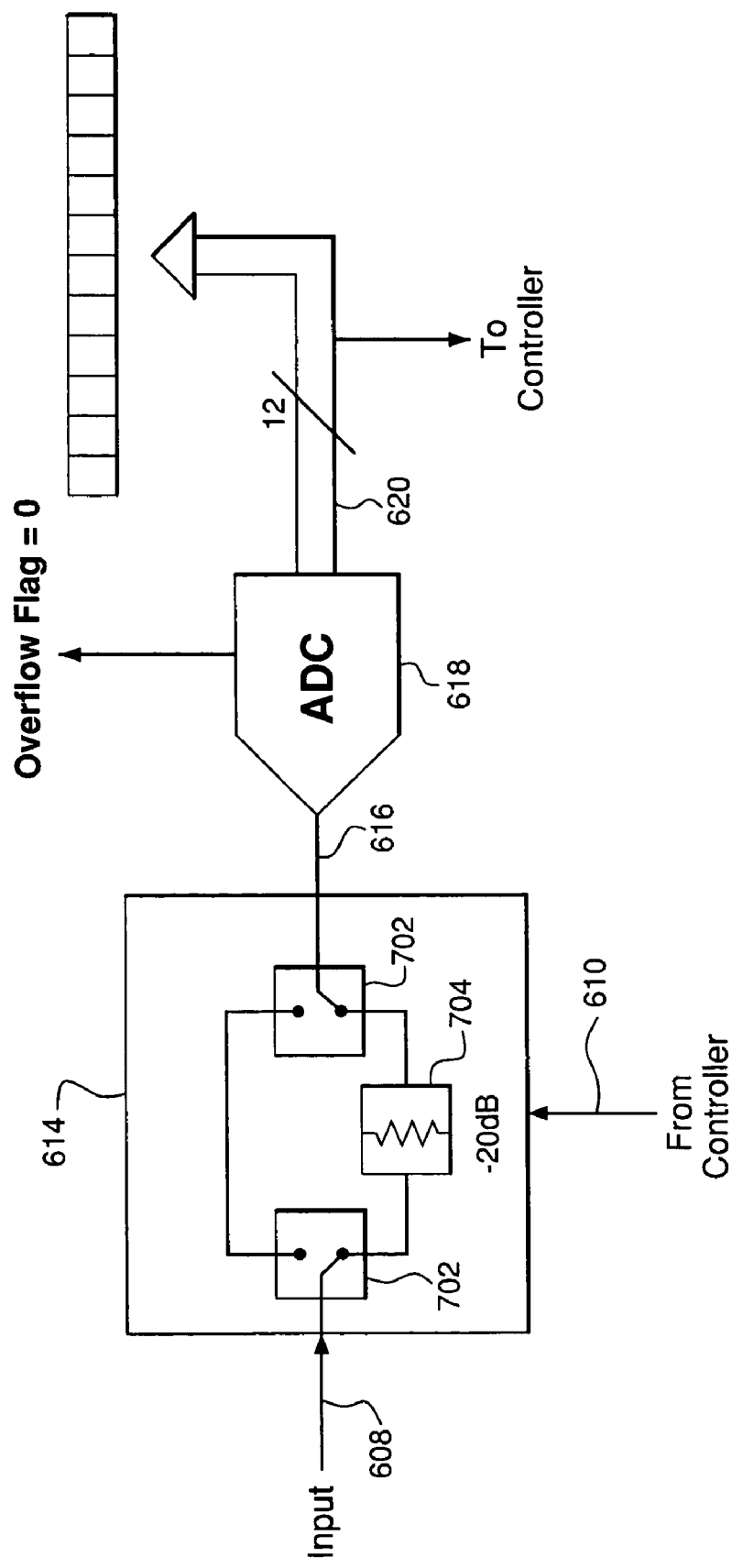
FIG. 7 shows a block diagram of the variable attenuator and the ADC of FIG. 6, according to one possible implementation of the receiver of FIG. 6.

FIG. 7 shows a block diagram of variable attenuator 614 and ADC 618 of FIG. 6, according to one possible implementation of receiver 600. In this particular implementation, ADC 618 is a 12-bit ADC, and variable attenuator has two switches 702 and a 20 dB attenuator 704. Switches 702 are controlled by control signal 610 to either bypass or apply 20 dB attenuator 704 to selectively attenuate IF input signal 608. Note that the size of the attenuator will typically depend on the signal requirements for the particular application.

The design of receiver 600 is based in part on the recognition that a spread-spectrum receiver can operate with received RF signals having negative signal-to-noise ratios (i.e., where the noise level is larger than the desired signal level). Referring again to FIG. 6, since the de-spreading processing of digital processing 632 concentrates the desired signal energy in a bandwidth corresponding to the user symbol rate, a signal having a positive $SN_rR$ can be generated (albeit at a lower data rate) during digital processing 632 even when the signal at ADC 618 has an $SN_rR$ that is small or even negative (albeit not too negative). Since noise and interference are uncorrelated with the de-spreading code applied by digital processing 632, noise is not concentrated in the reduced signal bandwidth. In a typical spread-spectrum receiver, the limiting noise is either thermal noise (at sensitivity) or non-coherent on-channel interference.

Figure 8:
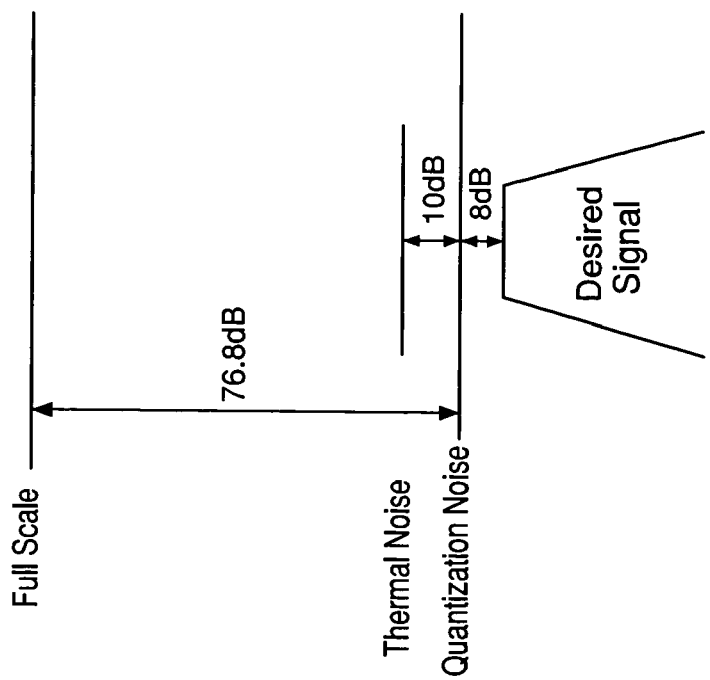
FIG. 8 shows a graphical representation of the relative signal and noise levels at sensitivity when the receiver of FIG. 6 is implemented using a 12-bit ADC for a UMTS signal having an $SN_tR$ of −18 dB.

FIG. 8 shows a graphical representation of the relative signal and noise levels at sensitivity when receiver 600 of FIG. 6 is implemented using a 12-bit ADC for a UMTS signal having an $SN_rR$ of −18 dB. Even though the received signal's $SN_rR$ is negative, receiver 600 can successfully operate due to the signal-concentration characteristics of spread-spectrum processing, where the de-spreading process implemented by digital processing 632 results in a positive $SN_rR$.

Figures 4, 5:
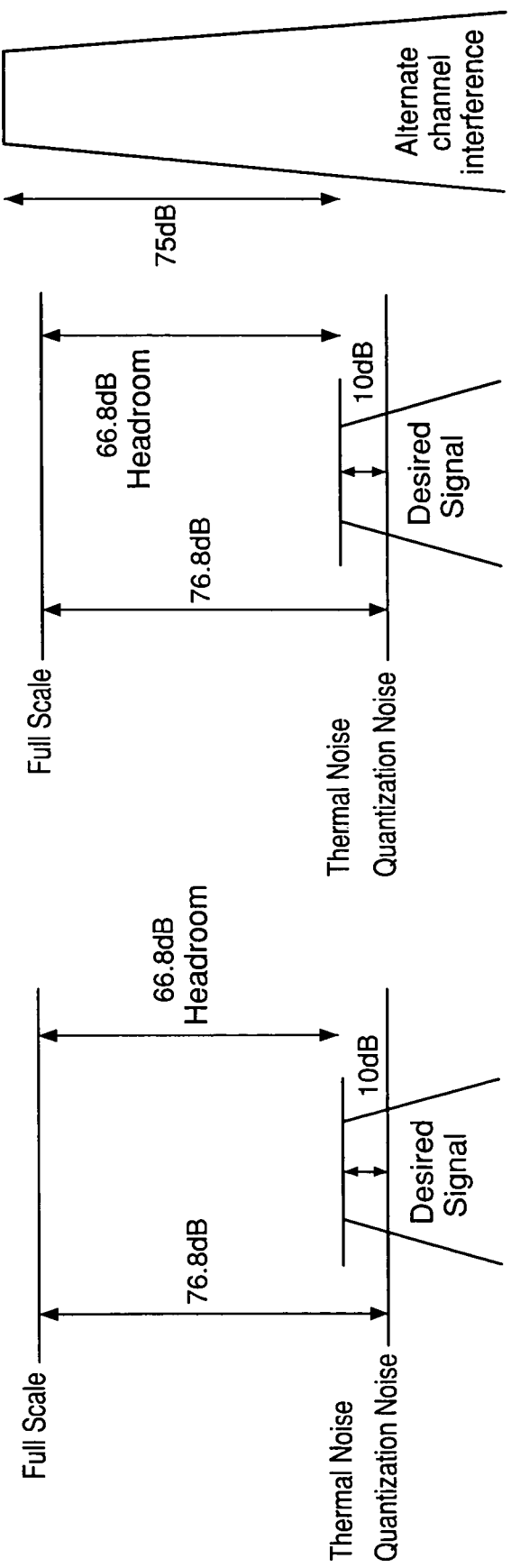
FIG. 4 shows a graphical representation of the relative signal and noise levels for the receiver of FIG. 1 implemented with a 12-bit ADC and receiving a UMTS signal at an $SN_tR$ of 0 dB.
FIG. 5 shows a graphical representation of the relative signal and noise levels for the receiver of FIG. 4 when the same 75 dB off-channel interference is introduced.
Figure 9:
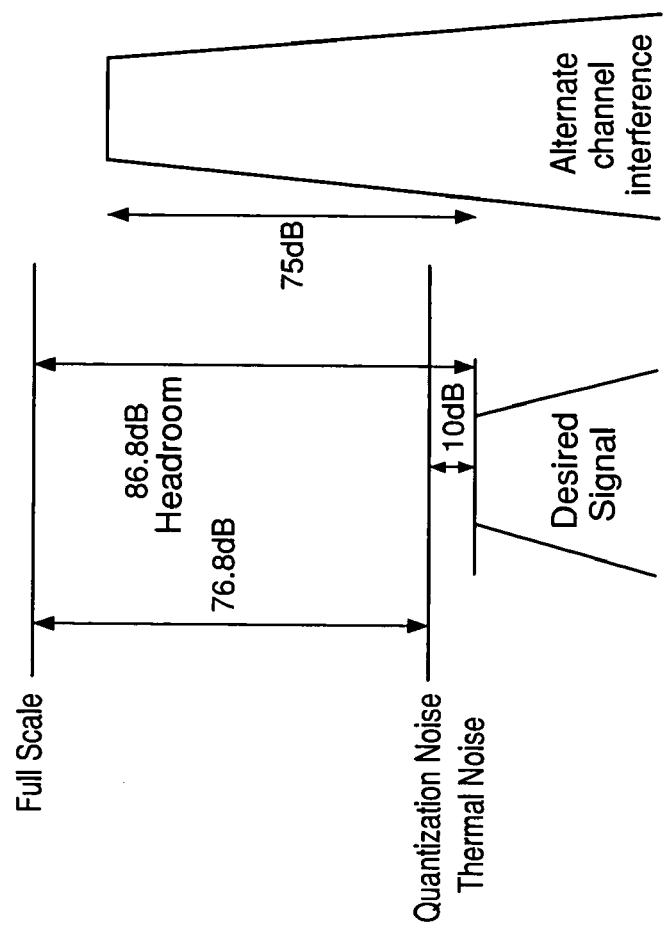

FIG. 9 shows a graphical representation of the relative signal and noise levels at 18 dB above sensitivity when the receiver of FIG. 8 is implemented using a 12-bit ADC for a UMTS signal having a signal-to-quantization-noise ($SN_qR$) of −10 dB, where 20 dB variable attenuator 614 of FIG. 6 is turned on. Here, the 20 dB of attenuation reduces the desired signal level such that there is 86.8 dB of ADC headroom, which, as shown in FIG. 9, enables the receiver to tolerate the same 75 dB interference that was tolerated using the 14-bit ADC of FIG. 3. Without the 20 dB of attenuation, the ADC headroom in the receiver of FIG. 9 would be only 66.8 dB (see FIG. 5), which is not enough tolerate the 75 dB interference without overflowing the A/D converter.

For a particular application, the amount of external attenuation that can be applied is bounded according to Equation (2) as follows:

$$P_{int}-P_{FS} \leq \text{Attenuator Value} \leq SN_qR+18 \text{ dB}, \quad (2)$$

where $P_{int}$ is the maximum interference power at the ADC input, $P_{FS}$ is the full-scale input of the ADC, and $SN_qR$ is the minimum signal-to-quantization-noise ratio at the interference test conditions without the presence of interference. In Equation (2), 18 dB is the lowest (negative) $SN_qR$ at the ADC input at which the signal can still be demodulated and meet the bit-error rate (BER) requirement for that particular application. In other words, the minimum external attenuation value that can be used is equal to how much the maximum allowable interference exceeds the full-scale ADC input power level prior to switching in the external attenuator. Similarly, the maximum external attenuation value that can be used is equal to 18 dB above the $SN_qR$ at the interference test level with no interference and no external attenuation.

As described previously, in a preferred implementation, variable attenuator 614 is turned off when the output of ADC 618 is relatively small and turned on when the ADC output is relatively large. By choosing appropriate threshold and attenuation values, receiver 600 should be sensitive enough to process relatively low desired signal levels in the absence of interference, yet capable of processing relatively high received signal levels, whether or not off-channel interference is present (e.g., high desired signal level with no off-channel interference or low desired signal level with strong off-channel interference). In that case, receiver 600 of the present invention can be implemented using a smaller, less-expensive ADC (in this particular case, 12 bits instead of 14 bits) for the same signal application as prior-art receiver 100 of FIG. 1.

In the example of FIGS. 8 and 9, the attenuation value of 20 dB is derived as follows. The desired signal level under interference test conditions is 18 dB above sensitivity (i.e., 66.8 dB below full scale). The $SN_qR$ at this level is +10 dB. The maximum interference level is 79 dB above the desired signal level, so the interference level exceeds the full-scale ADC input by 12.2 dB. Based on Equation (2), the attenuation value is bounded as follows:

12.2 dB≦Attenuator Value≦28 dB.

Choosing 20 dB for the attenuator value provides 8 dB of margin between the −10 dB $SN_qR$ when the attenuator is switched in and the −18 dB $SN_qR$ limit for demodulation of the desired signal with acceptable BER.

The present invention differs from conventional automatic gain control (AGC) applications that attenuate received signals prior to A/D conversion, in that AGC applications generate their feedback control signals by measuring only on-channel desired signal and/or noise power level and not off-channel interference (i.e., when there is no off-channel interference or after any such interference has been removed), while the present invention bases its feedback control signal on the total signal output by the ADC whether or not off-channel interference is present.

Moreover, the goal in AGC applications is to maintain a constant level for the desired signal (e.g., a fixed number of dB below the ADC's full scale. In the present invention, on the other hand, the level of the desired signal is substantially irrelevant as long as it falls somewhere within an acceptable range (which happens to include negative $SN_rR$ or $SN_qR$ levels).

Furthermore, the present invention does not have to distinguish whether a high AGC output level corresponds to a strong desired signal or a strong interference signal. As long as the maximum expected interference-to-carrier ratio is known a priori (and as long as the ratio is not too high for a given architecture), a predetermined amount of attenuation can be switched in regardless of what type of signal (desired or interference) is causing the upper threshold to be exceeded.

Note, however, that a receiver could in theory be implemented with conventional AGC control in addition to the attenuation control of the present invention.

In the embodiment of FIG. 6, the controller samples the digital output of the ADC. In one possible implementation, the variable attenuator is turned on before the ADC overflows. For example, the upper threshold level can be selected at some appropriate level below the ADC's full scale level (e.g., within 3 dB of saturation). In another implementation, the variable attenuator is not turned on until the ADC actually overflows. In this latter case, instead of or in addition to sampling the ADC digital output signal, the controller can sample a special overflow flag generated by the ADC (see FIG. 7) for use in controlling the operations of the variable attenuator.

Although the present invention has been described in the context of a receiver having a 12-bit ADC (with 11 effective bits) operating with a 61.44-MHz sample clock and a 3.84-MHz wide UMTS signal bandwidth, the invention can also be implemented in other contexts having different signals with different bandwidths, different sample clocks, and/or different ADCs. In general, the present invention can be implemented for any appropriate type of spread-spectrum communication system.

Although the present invention has been described in the context of a variable attenuator that selectively switches in or out a single, fixed amount of attenuation, other variable attenuation schemes can be implemented including gradually switching in multiple, fixed amounts of attenuation at different signal levels or even levels of attenuation that vary smoothly with signal level.

Although the present invention has been described in the context of receiver 600 of FIG. 6, which first converts from RF to IF, then attenuates, then digitizes, then converts from IF to baseband, then filters, and then de-spreads, the invention is not so limited. The present invention can also be implemented in the context of other types of receivers having different architectures. For example, the attenuation and even the digitization could be applied to the RF signal prior to conversion to IF, and/or the filtering and even the de-spreading could be implemented at IF prior to conversion to baseband. Moreover, the conversion from RF to baseband could be implemented in a single step, in either the analog or digital domain, without generating an intermediate IF signal.

Embodiments of the present invention may be implemented as circuit-based processes, including possible implementation on a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. In a spread-spectrum receiver, a method for processing a received analog spread-spectrum signal, comprising:
   determining whether to attenuate the received analog spread-spectrum signal;
   based on the attenuation determination, selectively attenuating the received analog spread-spectrum signal to generate a selectively attenuated analog spread-spectrum signal;
   digitizing the selectively attenuated analog spread-spectrum signal to generate a digital spread-spectrum signal;
   filtering the digital spread-spectrum signal in an attempt to compensate for interference in the received analog spread-spectrum signal to generate a filtered digital spread-spectrum signal; and
   de-spreading the filtered digital spread-spectrum signal to generate a de-spread digital signal, wherein:
   the attenuation determination is based on the amplitude of the digital spread-spectrum signal only after the digitizing and prior to the interference-compensation filtering and the de-spreading.

2. The invention of claim 1, wherein the filtering attempts to compensate for off-channel interference in the received analog spread-spectrum signal.

3. The invention of claim 1, wherein the selectively attenuated analog spread-spectrum signal has a negative signal-to-noise ratio (SNR).

4. The invention of claim 1, wherein:
   the received analog spread-spectrum signal is attenuated when the amplitude of the digital spread-spectrum signal is greater than an upper threshold; and
   the received analog spread-spectrum signal is not attenuated when the amplitude of the digital spread-spectrum signal is less than a lower threshold, wherein the upper threshold is greater than the lower threshold.

5. The invention of claim 4, wherein the upper threshold is greater than the lower threshold by an amount greater than the level of selective attenuation in order to provide hysteresis in the attenuation determination.

6. The invention of claim 1, wherein:
the received analog spread-spectrum signal is a radio frequency (RF) signal; and
further comprising:
converting the RF signal to an intermediate frequency (IF) prior to the digitization; and
converting the IF signal to baseband after digitization.

7. The invention of claim 6, wherein the filtering and the de-spreading are implemented at baseband.

8. The invention of claim 1, wherein:
the filtering attempts to compensate for off-channel interference in the received analog spread-spectrum signal;
the selectively attenuated analog spread-spectrum signal has a negative signal-to-noise ratio (SNR);
the received analog spread-spectrum signal is attenuated when the amplitude of the digital spread-spectrum signal is greater than an upper threshold;
the received analog spread-spectrum signal is not attenuated when the amplitude of the digital spread-spectrum signal is less than a lower threshold;
the upper threshold is greater than the lower threshold by an amount greater than the level of selective attenuation in order to provide hysteresis in the attenuation determination;
the received analog spread-spectrum signal is a radio frequency (RF) signal;
further comprising:
converting the RF signal to an intermediate frequency (IF) prior to the digitization; and
converting the IF signal to baseband after digitization; and
the filtering and the de-spreading are implemented at baseband.

9. A spread-spectrum receiver, comprising:
a variable attenuator adapted to selectively attenuate a received analog spread-spectrum signal to generate a selectively attenuated analog spread-spectrum signal;
an analog-to-digital converter (ADC) adapted to digitize the selectively attenuated analog spread-spectrum signal to generate a digital spread-spectrum signal;
an interference-compensation filter adapted to filter the digital spread-spectrum signal in an attempt to compensate for interference in the received analog spread-spectrum signal to generate a filtered digital spread-spectrum signal;
a digital processor adapted to de-spread the filtered digital spread-spectrum signal to generate a de-spread digital signal; and
a controller adapted to control the variable attenuator based on the amplitude of the digital spread-spectrum signal only after the digitizing by the ADC and prior to the interference-compensation filtering by the interference-compensation filter and the de-spreading of the digital processor.

10. The invention of claim 9, wherein the filter is adapted to attempt to compensate for off-channel interference in the received analog spread-spectrum signal.

11. The invention of claim 9, wherein:
the controller is adapted to control the variable attenuator to attenuate the received analog spread-spectrum signal when the amplitude of the digital spread-spectrum signal is greater than an upper threshold; and the controller is adapted to control the variable attenuator not to attenuate the received analog spread-spectrum signal when the amplitude of the digital spread-spectrum signal is less than a lower threshold, wherein the upper threshold is greater than the lower threshold.

12. The invention of claim 11, wherein the upper threshold is greater than the lower threshold by an amount greater than the level of selective attenuation in order to provide hysteresis in the attenuation determination.

13. The invention of claim 9, wherein:
the received analog spread-spectrum signal is a radio frequency (RF) signal; and
further comprising:
a mixer adapted to convert the RF signal to an intermediate frequency (IF) prior to the digitization; and
a digital downconverter adapted to convert the IF signal to baseband after digitization.

14. The invention of claim 13, wherein the filter and the digital processor are adapted to operate at baseband.

15. The invention of claim 9, wherein:
the filter is adapted to attempt to compensate for off-channel interference in the received analog spread-spectrum signal;
the controller is adapted to control the variable attenuator to attenuate the received analog spread-spectrum signal when the amplitude of the digital spread-spectrum signal is greater than an upper threshold;
the controller is adapted to control the variable attenuator not to attenuate the received analog spread-spectrum signal when the amplitude of the digital spread-spectrum signal is less than a lower threshold;
the upper threshold is greater than the lower threshold by an amount greater than the level of selective attenuation in order to provide hysteresis in the attenuation determination;
the received analog spread-spectrum signal is a radio frequency (RF) signal;
further comprising:
a mixer adapted to convert the RF signal to an intermediate frequency (IF) prior to the digitization; and
a digital downconverter adapted to convert the IF signal to baseband after digitization; and
the filter and the digital processor are adapted to operate at baseband.

16. The invention of claim 1, wherein the attenuation determination is based on the amplitude of the digital spread-spectrum signal in a time domain.

17. The invention of claim 6, wherein the attenuation determination is based on the amplitude of the digital IF signal.

18. The invention of claim 1, wherein:
the received analog spread-spectrum signal is attenuated when the amplitude of the digital spread-spectrum signal is greater than a first threshold;
the received analog spread-spectrum signal is not attenuated when the amplitude of the digital spread-spectrum signal is less than a second threshold, wherein the first threshold is greater than or equal to the second threshold;
a transition from the received analog spread-spectrum signal not being attenuated to the received analog spread-spectrum signal being attenuated occurs after (i) determining a first duration that the amplitude of the digital spread-spectrum signal is greater than the first threshold and (ii) comparing the first duration to a first specified amount of time to determine that the first duration is greater than the first specified amount of time; and a transition from the received analog spread-spectrum signal being attenuated to the received analog spread-spectrum signal not being attenuated occurs after (i) determining a second duration that the amplitude of the digital spread-spectrum signal is less than the second threshold and (ii) comparing the second duration to a second specified amount of time to determine that the second duration is greater than the second specified amount of time.

19. The invention of claim 1, wherein the attenuation determination is further based on a priori knowledge of maximum expected interference-to-carrier ratio.

20. The invention of claim 1, wherein the attenuation determination is independent of any determination of bit error rate.

21. The invention of claim 9, wherein the selectively attenuated analog spread-spectrum signal has a negative signal-to-noise ratio (SNR).

22. In a spread-spectrum receiver, a method for processing a received analog spread-spectrum signal, comprising:
   determining whether to attenuate the received analog spread-spectrum signal;
   based on the attenuation determination, selectively attenuating the received analog spread-spectrum signal to generate a selectively attenuated analog spread-spectrum signal;
   digitizing the selectively attenuated analog spread-spectrum signal to generate a digital spread-spectrum signal;
   filtering the digital spread-spectrum signal in an attempt to compensate for interference in the received analog spread-spectrum signal to generate a filtered digital spread-spectrum signal; and
   de-spreading the filtered digital spread-spectrum signal to generate a de-spread digital signal, wherein:
      the attenuation determination is based on the amplitude of the digital spread-spectrum signal prior to the interference-compensation filtering and the de-spreading;
      the filtering attempts to compensate for off-channel interference in the received analog spread-spectrum signal;
      the selectively attenuated analog spread-spectrum signal has a negative signal-to-noise ratio (SNR);
      the received analog spread-spectrum signal is attenuated when the amplitude of the digital spread-spectrum signal is greater than an upper threshold;
      the received analog spread-spectrum signal is not attenuated when the amplitude of the digital spread-spectrum signal is less than a lower threshold;
      the upper threshold is greater than the lower threshold by an amount greater than the level of selective attenuation in order to provide hysteresis in the attenuation determination;
      the received analog spread-spectrum signal is a radio frequency (RF) signal;
      further comprising:
         converting the RF signal to an intermediate frequency (IF) prior to the digitization; and
         converting the IF signal to baseband after digitization; and
      the filtering and the de-spreading are implemented at baseband.

23. In a spread-spectrum receiver, a method for processing a received analog spread-spectrum signal, comprising:
   determining whether to attenuate the received analog spread-spectrum signal;
   based on the attenuation determination, selectively attenuating the received analog spread-spectrum signal to generate a selectively attenuated analog spread-spectrum signal;
   digitizing the selectively attenuated analog spread-spectrum signal to generate a digital spread-spectrum signal;
   filtering the digital spread-spectrum signal in an attempt to compensate for interference in the received analog spread-spectrum signal to generate a filtered digital spread-spectrum signal; and
   de-spreading the filtered digital spread-spectrum signal to generate a de-spread digital signal, wherein:
      the attenuation determination is based on the amplitude of the digital spread-spectrum signal prior to the interference-compensation filtering and the de-spreading;
      the received analog spread-spectrum signal is attenuated when the amplitude of the digital spread-spectrum signal is greater than a first threshold;
      the received analog spread-spectrum signal is not attenuated when the amplitude of the digital spread-spectrum signal is less than a second threshold, wherein the first threshold is greater than or equal to the second threshold;
      a transition from the received analog spread-spectrum signal not being attenuated to the received analog spread-spectrum signal being attenuated occurs after (i) determining a first duration that the amplitude of the digital spread-spectrum signal is greater than the first threshold and (ii) comparing the first duration to a first specified amount of time to determine that the first duration is greater than the first specified amount of time; and
      a transition from the received analog spread-spectrum signal being attenuated to the received analog spread-spectrum signal not being attenuated occurs after (i) determining a second duration that the amplitude of the digital spread-spectrum signal is less than the second threshold and (ii) comparing the second duration to a second specified amount of time to determine that the second duration is greater than the second specified amount of time.

24. A spread-spectrum receiver, comprising:
   a variable attenuator adapted to selectively attenuate a received analog spread-spectrum signal to generate a selectively attenuated analog spread-spectrum signal;
   an analog-to-digital converter (ADC) adapted to digitize the selectively attenuated analog spread-spectrum signal to generate a digital spread-spectrum signal;
   an interference-compensation filter adapted to filter the digital spread-spectrum signal in an attempt to compensate for interference in the received analog spread-spectrum signal to generate a filtered digital spread-spectrum signal;
   a digital processor adapted to de-spread the filtered digital spread-spectrum signal to generate a de-spread digital signal; and
   a controller adapted to control the variable attenuator based on the amplitude of the digital spread-spectrum signal prior to the interference-compensation filter and the digital processor, wherein:
      the filter is adapted to attempt to compensate for off-channel interference in the received analog spread-spectrum signal;
      the controller is adapted to control the variable attenuator to attenuate the received analog spread-spectrum signal when the amplitude of the digital spread-spectrum signal is greater than an upper threshold;

the controller is adapted to control the variable attenuator not to attenuate the received analog spread-spectrum signal when the amplitude of the digital spread-spectrum signal is less than a lower threshold;

the upper threshold is greater than the lower threshold by an amount greater than the level of selective attenuation in order to provide hysteresis in the attenuation determination;

the received analog spread-spectrum signal is a radio frequency (RF) signal;

further comprising:

a mixer adapted to convert the RF signal to an intermediate frequency (IF) prior to the digitization; and a digital downconverter adapted to convert the IF signal to baseband after digitization; and the filter and the digital processor are adapted to operate at baseband.

* * * * *